United States Patent
Swoboda

(10) Patent No.: US 7,919,986 B2
(45) Date of Patent: Apr. 5, 2011

(54) POWER UP BIASING IN A SYSTEM HAVING MULTIPLE INPUT BIASING MODES

(75) Inventor: Gary L. Swoboda, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/545,366

(22) Filed: Aug. 21, 2009

(65) Prior Publication Data

US 2010/0244900 A1 Sep. 30, 2010

Related U.S. Application Data

(60) Provisional application No. 61/090,803, filed on Aug. 21, 2008.

(51) Int. Cl.
*H03K 19/094* (2006.01)
(52) U.S. Cl. .......................... 326/83; 326/86
(58) Field of Classification Search .............. 326/82, 326/83, 86, 93–95, 30
See application file for complete search history.

(56) References Cited

U.S. PATENT DOCUMENTS

| 5,329,176 A * | 7/1994 | Miller et al. ............ 326/21 |
| 5,604,454 A * | 2/1997 | Maguire et al. .......... 327/112 |
| 6,794,919 B1 * | 9/2004 | Volk et al. .............. 327/291 |
| 7,038,486 B2 * | 5/2006 | Aoyama et al. ........... 326/30 |

* cited by examiner

*Primary Examiner* — Rexford N Barnie
*Assistant Examiner* — Crystal L Hammond
(74) *Attorney, Agent, or Firm* — Robert D. Marshall, Jr.; W. James Brady; Frederick J. Telecky, Jr.

(57) ABSTRACT

This invention is an input bias control for a module input. A clock detect circuit generates a signal indicating whether an external clock signal is detected. An operational state detect circuit receives this signal and is responsive to an operational state of the module. The operational state detect circuit enables one of a pull-up and pull-down transistor corresponding said operational state of the module. The operational state detect circuit may the input buffer a predetermined time following external clock signal detection, which might be a following transition in the external clock signal. The operational state detect circuit enables the pull-up or pull-down transistor a predetermined time following enabling said input buffer.

4 Claims, 3 Drawing Sheets

POWER UP BIASING IN A SYSTEM HAVING MULTIPLE INPUT BIASING MODES

CLAIM OF PRIORITY

This application claims priority under 35 U.S.C. 119(e)(1) to U.S. Provisional Application No. 61/090,803 filed Aug. 21, 2008.

TECHNICAL FIELD OF THE INVENTION

The technical field of this invention is synchronous systems using multiple finite state machines.

BACKGROUND OF THE INVENTION

This invention operates in systems using multiple finite state machines. The finite state machines may be asynchronous in that their operations required differing amounts of time. Using such a system is complicated by the need to synchronize the operation of these multiple finite state machines.

SUMMARY OF THE INVENTION

This invention is an input bias control for a module input. A clock detect circuit generates a signal indicating whether an external clock signal is detected. An operational state detect circuit receives this signal and is responsive to an operational state of the module. The operational state detect circuit enables one of a pull-up and pull-down transistor corresponding said operational state of the module. The operational state detect circuit may the input buffer a predetermined time following external clock signal detection, which might be a following transition in the external clock signal. The operational state detect circuit enables the pull-up or pull-down transistor a predetermined time following enabling said input buffer.

BRIEF DESCRIPTION OF THE DRAWINGS

These and other aspects of this invention are illustrated in the drawings, in which.

DETAILED DESCRIPTION OF PREFERRED EMBODIMENTS

There are times where multiple finite state machines are operated in parallel. These state machines may or may not be able to provide input an output at the same pace. In this case these state machines provide a system ready indication when they are able to accept input and provide output. This system ready output is combined in a manner to determine when all of these machines are ready to proceed. These state machines literally vote on when to proceed. A unanimous vote to proceed is required before the state machines proceed.

Figure 1:
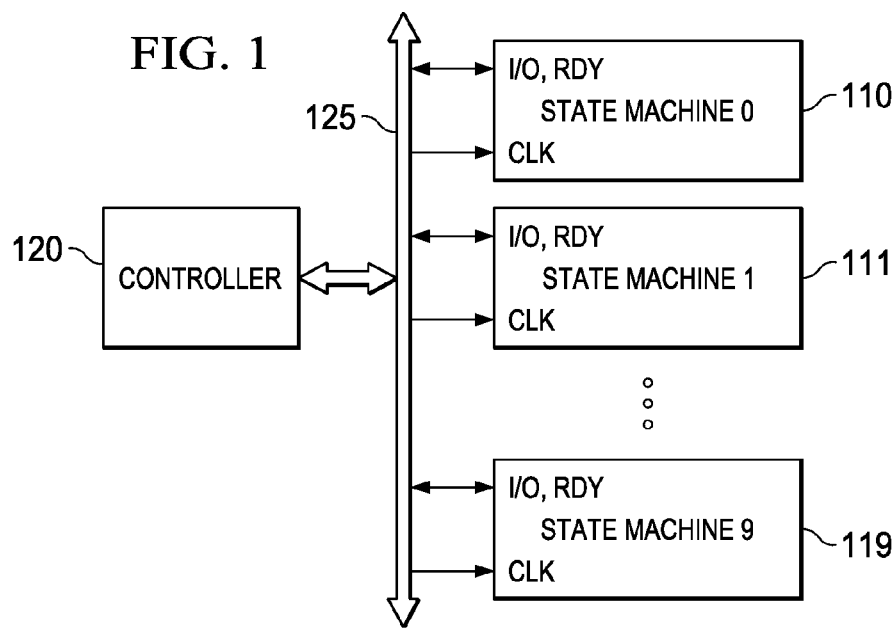
FIG. 1 illustrates an example system using multiple finite state machines.

FIG. 1 illustrates an example system using multiple finite state machines. FIG. 1 illustrate finite state machine 0 110, finite state machine 1 111 and finite state machine 9 119 representing the multiple finite state machines. Each finite state machine 110 to 119 receives a clock signal from bus 125. Each finite state machine 110 to 119 has a combined input/output (I/O) and ready signal (RDY) line connected to bus 125. This single line serves both as input and output to the finite state machine and enables ready signaling as detailed below. Controller 120 is also connected to bus 125. Controller 120 can supply the clock signals to the finite state machines 110 to 119, supply inputs, receive outputs and control the system.

If the voting is needed but not available a loss of synchronization of some of the machines may occur with a corresponding system malfunction. This could result in a catastrophic failure in certain system applications. A method to detect that this may occur and prevent this from happening is described herein.

Figure 2:
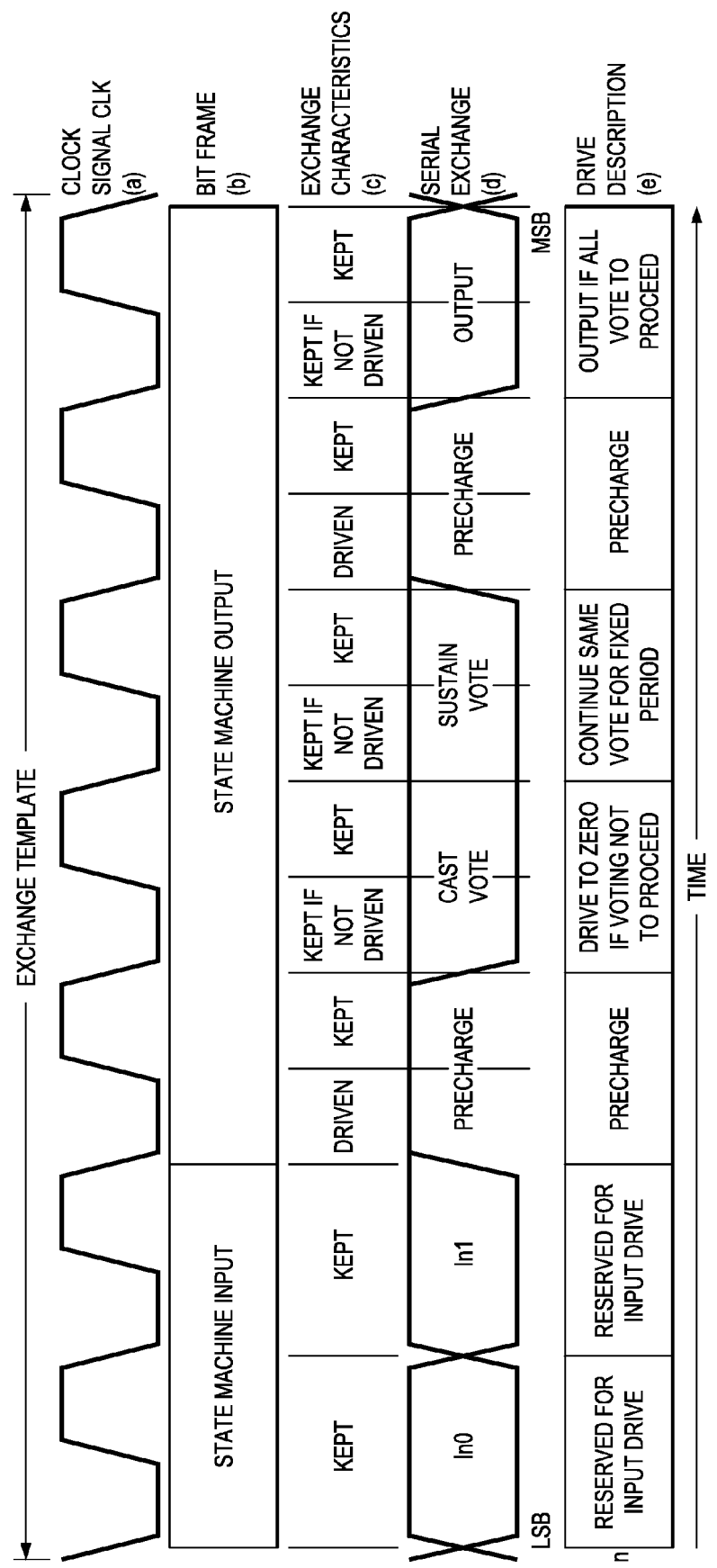
FIG. 2 illustrates an example of information exchange in a system such as illustrated in FIG. 1.

With minimum pin interfaces illustrated in FIG. 1 the information being exchanged and the vote to proceed can exchanged serially with a bit or bits in the stream providing a means for the voting to proceed. FIG. 2 illustrates an example of such an exchange.

FIG. 2a illustrates the clock signal CLK supplied to all finite state machines 110 to 119. FIG. 2b illustrates the separation of time defined by clock pulses into a state machine input period and a state machine output period. The example illustrated in FIG. 2 shows two clock cycles in the state machine input period and five clock cycles in the state machine output period. These intervals are exemplary only, other time lengths are feasible.

FIGS. 2c and 2d illustrate further division of the state machine input period and the state machine output period into specific signaling intervals. In this example, a least significant bit In0 of an input is signaled during a first clock cycle of the state machine input period. As noted in FIG. 2c, this value is kept on the signaling line. A most significant bit In1 of the input is signaled during a second clock cycle of the state machine input period. FIG. 2c shows this value is also kept on the signaling line. FIG. 2e illustrates that these clock cycles are "reserved for input drive."

The first clock cycle of the state machine output period is reserved for precharge. As detailed below the voting using ready signals involves a precharge-conditional discharge sequence. The first clock cycle of the state machine output period is this precharge driven by controller 120 during a first half cycle and held by a keeper circuit during a second half cycle.

FIG. 2d shows the next clock cycle in this example devoted to the finite state machine casting votes. This exact mechanism will be further explained below. FIG. 2c shows that a first half cycle is devoted to being driven or kept. Whether this is driven to zero or kept high depends upon the vote cast. FIG. 2c shows the second half cycle which is kept only. FIG. 2d shows a second voting cycle called "Sustain Vote" which is the same as the initial "Cast Vote" cycle.

FIG. 2d then shows another precharge sequence. The next clock cycle of the state machine output period is this precharge driven by controller 120 during a first half cycle and held by a keeper circuit during a second half cycle. FIG. 2d then shows an output cycle based upon a conditional discharge sequence. FIG. 2 shows output of only a single bit, however this is exemplary only and more bits can be transmitted as needed.

In order to increase efficiency controller 120 selects the information that is transferred in the exchange template shown in FIG. 2. The input, voting and output can be included and excluded. A means to inform all participants of the format of the exchange is provided.

The participants in an exchange may be defined by a procedure other than the procedure defining the format. It is therefore possible to specify the use of a format that does not support voting when a vote to proceed is needed.

The RDY bit(s) with some transfer formats is used to indicate the participants have completed the processing of the input information received previously and are ready to output information. When the RDY bit in the exchange is reached a participant indicates it is not ready to proceed until it has met the above mentioned criteria.

Figure 3:
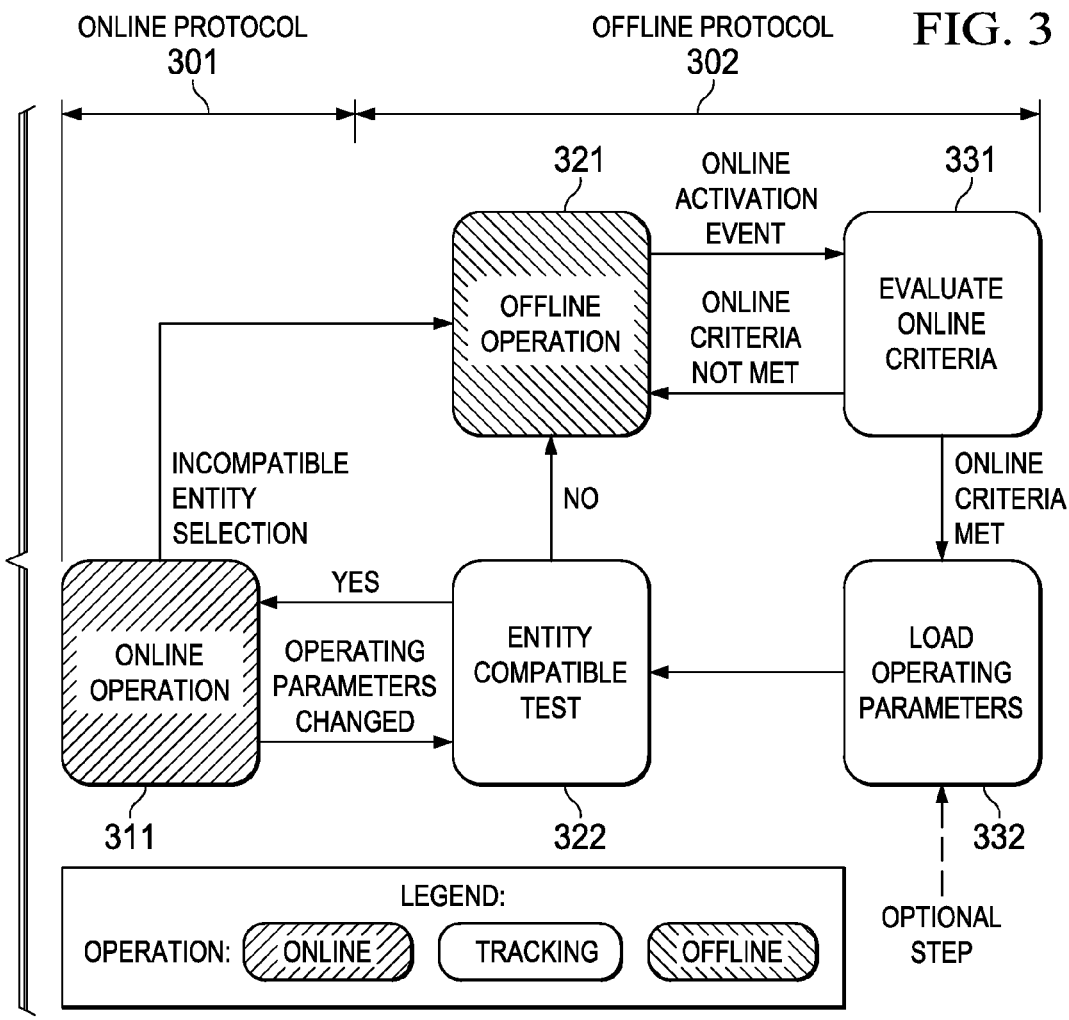
FIG. 3 illustrates a high level conceptual view of Online/Offline operation of a system such as illustrated in FIG. 1.

FIG. 3 illustrates a high level conceptual view of Online/Offline operation. When operating parameters are changed (block 311) they are checked (block 322) to determine whether they are compatible with the entity that the finite state machine controls. When this check (block 311) finds compatibility (Yes response from block 322), the online operation is resumed. When this check (block 311) finds no compatibility (No response from block 321), the finite state machine is placed offline (block 321). Likewise, the finite state machine is also placed offline (block 321) when an entity selection is about to occur or has already occurred and there is a known incompatibility (Incompatible entry selection output of block 311).

Online activation events to block 321 are provided to place an offline participant (block 321) online. Such events initiate a sequence that may place the participant online. This sequence may include testing criteria (block 331) that must be met for online placement and the load of the operating parameters that would be used if the participant is placed online. When this check (block 331) finds the online criteria is not met (Online criteria not met response from block 331), the system remains in offline operation. When this check (block 331) finds the online criteria is met (Online criteria is met response from block 331), then block 332 loads operation parameters with possible external input. The check for compatibility with the entity is performed before the finite state machine is placed online. Then the system advances to block 322 to again test for compatibility and returns online at block 311.

This is compared to the capability of the protocol being used or about to be used to determine whether the protocol is compatible with the entity selected or about to be selected. When the two are incompatible the finite state machine is placed offline before operation with the incompatibility is attempted.

It is possible to specify a feature that is not supported by any participant. In this case they are all placed offline. While offline they ignore subsequent input except for reset events and an online activation event. They may also respond to a limited number of other conditions if desired but they do not process information in the same manner as if they were online.

The system behavior for all offline case is that all finite state machines are parked in a safe and known state where system operation is corrupted. The finite state machines ignore input except as described above. When this input includes stall information there is no response from offline finite state machines. Consequently there is a system hang. This system hang is non-disturbing to the system as the participants are offline and controller 120 sees the hang.

Controller 120 can detect the hang described above. Since all finite state machines are offline controller 120 can take actions to ignore the not ready condition and proceed. It can then place itself in a state where it initiates the Online Activation Event. Following this event the operating parameters are loaded with values that at least one finite state machine determines it supports. When the check for support occurs, one or more finite state machines are placed online. The system operation is not aware of this malfunction and recovery and is not affected by it.

Figure 4A:
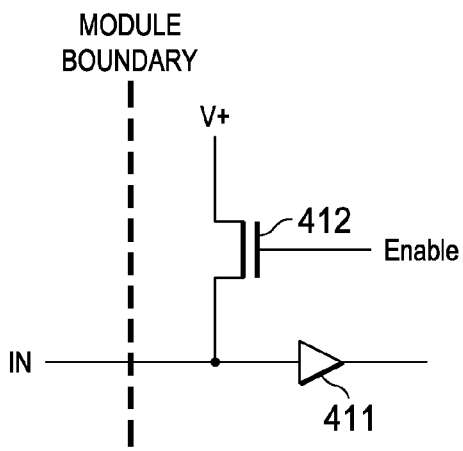
FIG. 4 illustrates a pull-up and a pull-down input bias circuit according to the prior art.
Figure 4B:
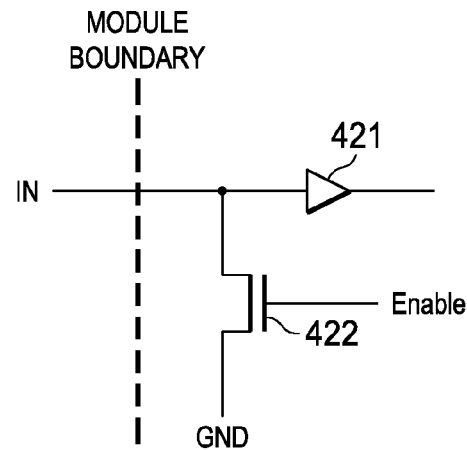

Normally inputs are created with circuitry that biases them in a way that they do not float. This is commonly handled with a weak drive pull-up or pull-down device. FIG. 4 illustrates this prior art. In FIG. 4 circuits inside the module are to the left of the module boundary. In FIG. 4a external input IN supplies input buffer 411. Pull-up keeper 412 pulls the input line to the positive supply voltage V+ to avoid a floating input. In FIG. 4b external input IN supplies input buffer 421. Pull-down keeper 422 pulls the input line to the ground to avoid a floating input. It is known in the art to construct transistors 412 and 422 with narrow channel widths capable of supplying only limited current. The current supplied by these transistors is smaller than the drive current of circuit driving the input line. FIGS. 4a and 4b illustrate N-channel transistors but P-channel transistors may be used.

If the normal operation of the interface includes a keeper as illustrated in FIG. 4, the pull-up or pull-down operation of the input of a powered ON device conflicts with the operation of keepers in already operating entities.

There are several ways to avoid this disruption of the system. The inputs could be constructed having no bias when initially powered up. An input buffer could be constructed having circuitry that negates the effects of a floating input. The presence of controller 120 could be detected in some manner. This may be by detecting the presence of a clock. The input circuitry could be enabled with the timing most compatible with the operation of the interface operating with unknown characteristics. The input circuitry could be enabled with the timing most compatible operating mode with the operation of the interface operating with unknown characteristics.

Figure 5:
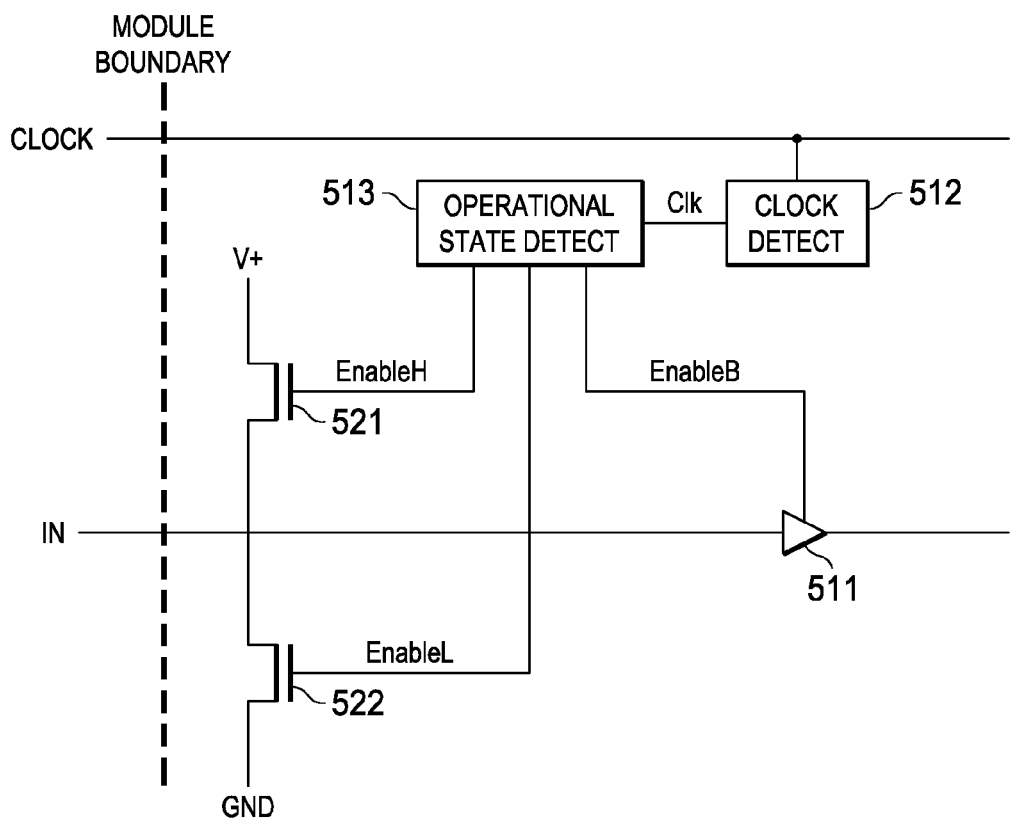
FIG. 5 illustrates the input bias circuit of this invention.

FIG. 5 illustrates the biasing circuit of this invention. Circuits to the left of the module boundary are within the module. External input IN supplies input buffer 511. External clock CLOCK supplies internal circuits (not shown). Clock detect 512 detects the presence of a clock signal. Clock detect 512 signals operational state detect 513 via signal CLK. Operational state detect 513 is responsive to the operational state of the corresponding finite state machine. As noted above, this operational state is preferably responsive to other inputs not shown. Operational state detect 513 supplies enable signals to pull-up transistor 521, pull-down transistor 522 and input buffer 511. EnableB signal from operational state detect 513 enables input buffer 511 at an appropriate time following clock detect corresponding to the operational mode. EnableH signal from operational state detect 513 enables pull-up transistor 521 at an appropriate time following clock detect corresponding to the operational mode. EnableL signal from operational state detect 513 enables pull-down transistor 522 at an appropriate time following clock detect corresponding to the operational mode.

For example, after detecting an interface clock with a clock pin with a fixed bias in clock detect 512, input buffer 511 could be enabled on the clock edge where data changes. At the same time an appropriate keeper operation is enabled. The enabled keeper provides the correct bias. Correct operation of the input may require the keeper bias to be enabled a time delay after the input buffer is enabled.

What is claimed is:

1. An input bias control for a module input comprising:
an input buffer receiving an external input signal via an input terminal;
a clock detect circuit receiving an external clock signal and generating a clock detect signal indicating whether the external clock signal is detected;
a pull-up transistor having a source-drain path connected between a positive supply voltage and said input terminal and a gate;
a pull-down transistor having a source-drain path connected between ground and said input terminal and a gate; and
an operational state detect circuit receiving said clock detect signal and responsive to an operational state of the module, said operational state detect circuit connected to said gate of said pull-up transistor and said gate of said pull-down transistor, said operational state detect circuit enabling one of said pull-up and pull-down transistors corresponding to said operational state of the module when said clock detect signal indicates said external clock signal is detected.

2. An input bias control for a module input comprising:
an input buffer receiving an external input signal via an input terminal and including an enable input receiving a signal to enable said input buffer;
a clock detect circuit receiving an external clock signal and generating a clock detect signal indicating whether the external clock signal is detected;
a pull-up transistor having a source-drain path connected between a positive supply voltage and said input terminal and a gate;
a pull-down transistor having a source-drain path connected between ground and said input terminal and a gate; and
an operational state detect circuit receiving said clock detect signal and responsive to an operational state of the module, said operational state detect circuit connected to said gate of said pull-up transistor and said gate of said pull-down transistor, said operational state detect circuit enabling one of said pull-up and pull-down transistors corresponding said operational state of the module when said clock detect signal indicates said external clock signal is detected, said operation state detect circuit is further connected to said enable input of said input buffer, said operational state detector enabling said input buffer upon a predetermined time following said clock detect signal indicating that the external clock signal is detected.

3. The input bias control of claim 2, wherein:
said predetermined time is a following transition in said external clock signal.

4. The input bias control of claim 2, wherein:
said operational state detect circuit enables said one of said pull-up and pull-down transistors a predetermined time following enabling said input buffer.

* * * * *